(12) United States Patent
Zhang et al.

(10) Patent No.: US 10,676,647 B1
(45) Date of Patent: Jun. 9, 2020

(54) COMPOSITION FOR TUNGSTEN CMP

(71) Applicant: Cabot Microelectronics Corporation, Aurora, IL (US)

(72) Inventors: Na Zhang, Naperville, IL (US); Kevin P. Dockery, Aurora, IL (US); Zhao Liu, Naperville, IL (US); Roman A. Ivanov, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 16/236,962

(22) Filed: Dec. 31, 2018

(51) Int. Cl.
  *G09G 1/02* (2006.01)
  *C09G 1/02* (2006.01)
  *H01L 21/321* (2006.01)

(52) U.S. Cl.
  CPC ............ *C09G 1/02* (2013.01); *H01L 21/3212* (2013.01)

(58) Field of Classification Search
  CPC ...................................................... C09G 1/02
  See application file for complete search history.

(56) References Cited

U.S. PATENT DOCUMENTS

| | | |
|---|---|---|
| 6,136,711 A | 10/2000 | Grumbine et al. |
| 9,631,122 B1 | 4/2017 | Dockery et al. |
| 9,771,496 B2 * | 9/2017 | Dockery ................. B24B 37/24 |
| 2003/0166337 A1 | 9/2003 | Wang et al. |
| 2004/0077295 A1 | 4/2004 | Hellring et al. |
| 2005/0029491 A1 | 2/2005 | Liu |
| 2014/0273458 A1 | 9/2014 | Shi et al. |
| 2015/0259804 A1 | 9/2015 | Lin et al. |

FOREIGN PATENT DOCUMENTS

JP    2005123577 A    12/2005

* cited by examiner

*Primary Examiner* — Roberts P Culbert
(74) *Attorney, Agent, or Firm* — Thomas Omholt; Erika S. Wilson; Christopher C. Streinz

(57) ABSTRACT

A chemical mechanical polishing composition includes a water based liquid carrier, cationic abrasive particles dispersed in the liquid carrier, a first amino acid compound having an isoelectric point of less than 7 and a second amino acid compound having an isoelectric point of greater than 7. The pH of the composition is in a range from about 1 to about 5. A method for chemical mechanical polishing a substrate including a tungsten layer includes contacting the substrate with the above described polishing composition, moving the polishing composition relative to the substrate, and abrading the substrate to remove a portion of the tungsten from the substrate and thereby polish the substrate.

29 Claims, No Drawings

COMPOSITION FOR TUNGSTEN CMP

BACKGROUND OF THE INVENTION

Chemical mechanical polishing (CMP) compositions and methods for polishing (or planarizing) the surface of a substrate are well known in the art. Polishing compositions (also known as polishing slurries, CMP slurries, and CMP compositions) for polishing metal layers (such as tungsten) on a semiconductor substrate may include abrasive particles suspended in an aqueous solution, chemical accelerators such as oxidizers, chelating agents, and the like, and corrosion/etch inhibitors for reducing the rate at which the metal etches in the CMP slurry.

In tungsten plug and interconnect processes, tungsten is generally deposited over a dielectric and within openings formed therein. The excess tungsten over the dielectric layer is then removed during a CMP operation to form tungsten plugs and interconnects within the dielectric. As semiconductor device feature sizes continue to shrink, meeting device requirements including planarity and defect requirements has become more difficult in CMP operations such as tungsten CMP operations. For example, slurry induced defects including excessive localized corrosion can reduce device yields. Excessive array erosion, localized erosion, and tungsten plug and line recessing, can also compromise overall electrical performance and reduce device yields.

Commercially available tungsten CMP slurries commonly make use of a hydrogen peroxide oxidizer. While there are many advantages to the use of hydrogen peroxide, it is known to contribute to excessive tungsten etching in certain CMP operations. There remains a need in the industry for tungsten CMP slurries (or compositions) that are less corrosive towards tungsten. Moreover, as is well known in the art, the semiconductor industry is subject to continuing and severe downward pricing pressure that extends to the CMP consumables themselves (e.g., to the CMP slurries and pads). Such pricing pressure poses a challenge to the slurry formulator as the pressure to reduce costs often conflicts with the desired slurry performance metrics. Thus, there is also a real need in the industry for CMP slurries that are stable and that provide high throughput at reduced overall costs.

BRIEF SUMMARY OF THE INVENTION

A chemical mechanical polishing composition for polishing a substrate having a tungsten layer is disclosed. The polishing composition comprises, consists of, or consists essentially of a water based liquid carrier and cationic abrasive particles dispersed in the liquid carrier. The composition further includes a tungsten corrosion inhibitor having an isoelectric point of less than 7 and a tungsten corrosion inhibitor having an isoelectric point of greater than 7. The pH of the composition is in a range from about 1 to about 5. A method for chemical mechanical polishing a substrate including a tungsten layer is further disclosed. The method may include contacting the substrate with the above described polishing composition, moving the polishing composition relative to the substrate, and abrading the substrate to remove a portion of the tungsten from the substrate and thereby polish the substrate.

DETAILED DESCRIPTION OF THE INVENTION

A chemical mechanical polishing composition for polishing a substrate having a tungsten layer is disclosed. The polishing composition comprises, consists of, or consists essentially of a water based liquid carrier, cationic abrasive particles dispersed in the liquid carrier, a first tungsten corrosion inhibitor (e.g., a first amino acid compound) having an isoelectric point of less than 7, and a second tungsten corrosion inhibitor (e.g., a second amino acid compound different from the first amino acid compound) having an isoelectric point of greater than 7. The pH of the composition is in a range from about 1 to about 5. The polishing composition may further optionally include an iron containing accelerator, such as a soluble iron accelerator, a stabilizer bound to the iron containing accelerator, and a hydrogen peroxide oxidizer. In one embodiment, the first amino acid compound may be glycine and/or valine and the second amino acid compound may be histidine, arginine, and/or lysine.

The disclosed polishing compositions and corresponding (CMP methods) may confer significant and unexpected advantages. For example, the disclosed polishing compositions tend to be both chemically and colloidally stable such that both the pH of the composition and the average size of abrasive particles in the composition remain stable with time (e.g., essentially unchanged with time). The polishing compositions may further provide improved anti-corrosion performance (e.g., reduced tungsten etching) and improved shelf and pot life. Moreover, the polishing compositions and corresponding CMP methods may provide improved planarity including improved array erosion, localized erosion, and tungsten plug and line recessing.

It will be appreciated that the disclosed CMP compositions may be advantageously utilized for bulk tungsten removal and/or tungsten buff CMP operations. Bulk removal operations may require higher tungsten removal rates while buff operations may require lower defect levels and/or more stringent corrosion control. The disclosed CMP compositions may also be advantageously utilized for a single-step tungsten CMP operation. While the disclosed embodiments may be particularly well suited for tungsten buff operations, they are not intended to be limited to any particular tungsten CMP operation.

The polishing composition contains an abrasive including metal oxide (abrasive) particles suspended in a liquid carrier. The abrasive may include substantially suitable metal oxide particles, for example, including colloidal silica particles and/or fumed silica particles. As used herein the term colloidal silica particles refers to silica particles that are prepared via a wet process rather than a pyrogenic or flame hydrolysis process which commonly produces structurally different particles. Such colloidal silica particles may be aggregated or non-aggregated. Non-aggregated particles are individually discrete particles that may be spherical or nearly spherical in shape, but can have other shapes as well (such as generally elliptical, square, or rectangular cross-sections). Aggregated particles are particles in which multiple discrete particles are clustered or bonded together to form aggregates having generally irregular shapes.

Colloidal silica may be precipitated or condensation-polymerized silica, which may be prepared using any method known to those of ordinary skill in the art, such as by the sol gel method or by silicate ion-exchange. Condensation-polymerized silica particles are often prepared by condensing $Si(OH)_4$ to form substantially spherical particles. The precursor $Si(OH)_4$ may be obtained, for example, by hydrolysis of high purity alkoxysilanes, or by acidification of aqueous silicate solutions. Such abrasive particles may be prepared, for example, in accordance with U.S. Pat. No. 5,230,833 or may be obtained from any of a number of commercial suppliers, for example, including EKA Chemicals, Fuso Chemical Company, Nalco, DuPont, Bayer, Applied Research, Nissan Chemical, and Clariant.

Pyrogenic silica is produced via a flame hydrolysis process in which a suitable feedstock vapor (such as silicon tetra-chloride) is combusted in a flame of hydrogen and oxygen. Molten particles of roughly spherical shapes are formed in the combustion process, the diameters of which may be varied via process parameters. These molten spheres, commonly referred to as primary particles, fuse with one another by undergoing collisions at their contact points to form branched, three dimensional chain-like aggregates. Fumed silica abrasives are commercially available from a number of suppliers including, for example, Cabot Corporation, Evonic, and Wacker Chemie.

The polishing composition may include substantially any suitable amount of the abrasive particles. If the polishing composition comprises too little abrasive, the composition may not exhibit a sufficient removal rate. In contrast, if the polishing composition comprises too much abrasive, then the polishing composition may exhibit undesirable polishing performance and/or may not be cost effective and/or may lack stability. The polishing composition may include about 0.01 wt. % or more abrasive particles (e.g., about 0.05 wt. % or more). The polishing composition may include about 0.1 wt. % or more (e.g., about 0.2 wt. % or more, about 0.3 wt. % or more, or 0.5 wt. % or more) abrasive particles. The concentration of abrasive particles in the polishing composition is generally less than about 20 wt. %, and more typically about 10 wt. % or less (e.g., about 5 wt. % or less, about 3 wt. % or less, about 2 wt. % or less, or about 1.5 wt. % or less, or about 1 wt. % or less). It will be understood that the abrasive particles may be present in the polishing composition at a concentration bounded by any two of the aforementioned endpoints. For example, the concentration of abrasive particles in the polishing composition may be in a range from about 0.01 wt. % to about 20 wt. %, and more preferably from about 0.05 wt. % to about 10 wt. % (e.g., from about 0.1 wt. % to about 5 wt. %, from about 0.1 wt. % to about 3 wt. %, from about 0.1 wt. % to about 2 wt. %, from about 0.2 wt. % to about 2 wt. %, from about 0.2 wt. % to about 1.5 wt. %, or from about 0.2 wt. % to about 1 wt. %).

The abrasive may include cationic (positively charged) abrasive particles. For example, the abrasive may include cationic silica abrasive particles. The cationic silica particles may have a permanent positive charge or a non-permanent positive charge. For example, the cationic silica abrasive particles may have a permanent positive charge. By permanent positive charge it is meant that the positive charge on the silica particles is not readily reversible, for example, via flushing, dilution, filtration, and the like. A permanent positive charge may be the result, for example, of covalently bonding a cationic compound with the colloidal silica. A permanent positive charge is in contrast to a reversible positive charge that may be the result, for example, of an electrostatic interaction between a cationic compound and the colloidal silica.

Notwithstanding, as used herein, a permanent positive charge of at least 10 mV means that the zeta potential of the colloidal silica particles remains above 10 mV after the following three step ultrafiltration test. A volume of the polishing composition (e.g., 200 ml) is passed through a Millipore Ultracell regenerated cellulose ultrafiltration disk (e.g., having a MW cutoff of 100,000 Daltons and a pore size of 6.3 nm). The remaining dispersion (the dispersion that is retained by the ultrafiltration disk) is collected and replenished to the original volume with pH adjusted deionized water. The deionized water is pH adjusted to the original pH of the polishing composition using a suitable inorganic acid such as nitric acid. This procedure is repeated for a total of three ultrafiltration cycles (each of which includes an ultrafiltration step and a replenishing step). The zeta-potential of the triply ultra-filtered and replenished polishing composition is then measured and compared with the zeta potential of the original polishing composition. This three step ultrafiltration test is described in further detail in Example 10 of commonly assigned U.S. Pat. No. 9,422,456, which is incorporated herein by reference in its entirety.

Cationic silica abrasive particles having a permanent positive charge may be prepared via treating the silica particles with an aminosilane compound as disclosed in commonly assigned U.S. Pat. Nos. 7,994,057 and 9,028,572 or in U.S. Pat. No. 9,382,450, each of which is incorporated by reference herein in its entirety. Example cationic silica particles may be treated using any suitable treating method to obtain the cationic particles. For example, a quaternary aminosilane compound and the colloidal silica may be added simultaneously to some or all of the other components in the polishing composition. Alternatively, the silica particles may be treated with a quaternary aminosilane compound (e.g., via a heating a mixture of the colloidal silica and the aminosilane) prior to mixing with the other components of the polishing composition. Colloidal silica particles having a permanent positive charge may also be obtained by incorporating a chemical species, such as an aminosilane compound, in the colloidal silica particles as disclosed in in commonly assigned U.S. Pat. No. 9,422,456.

Cationic silica abrasive particles having a non-permanent positive charge may be prepared via introducing a cationic surfactant into the polishing composition, for example, as disclosed commonly assigned U.S. Pat. No. 9,631,122, which is incorporated by reference herein in its entirety. Such cationic surfactants may include, for example, one or a combination of tetrabutylammonium, tetrapentylammonium, tetrabutylphosphonium, tributylmethylphosphonium, tributyloctylphosphonium, and benzyltributylammonium.

As noted above, the abrasive particles (such as silica particles) may have a positive charge in the polishing composition. The charge on dispersed particles is commonly referred to in the art as the zeta potential (or the electrokinetic potential). The zeta potential of a particle refers to the electrical potential difference between the electrical charge of the ions surrounding the particle and the electrical charge of the bulk solution of the polishing composition (e.g., the liquid carrier and any other components dissolved therein). The zeta potential generally depends on the pH of the aqueous medium. For a given polishing composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). The zeta potential of a dispersion such as a polishing composition may be obtained using commercially available instrumentation such as the Zetasizer available from Malvern Instruments, the ZetaPlus Zeta Potential Analyzer available from Brookhaven Instruments, and/or an electro-acoustic spectrometer available from Dispersion Technologies, Inc.

In certain embodiments, the cationic silica abrasive particles have a zeta potential of about 10 mV or more (e.g., about 15 mV or more, about 20 mV or more, about 25 mV or more, or about 30 mV or more) in the polishing composition (e.g., in a pH range from about 1 to about 5 and in the presence of the first and second amino acid compounds disclosed below and other optional additives). The cationic silica abrasive particles may have a zeta potential of about 50 mV or less (e.g., about 45 mV or less or about 40 mV or less) in the polishing composition. It will be understood that the cationic silica abrasive particles may have a zeta potential in a range bounded by any two of the aforementioned endpoints. For example, the cationic silica abrasive particles may have a zeta potential in a range from about 10 mV to about 50 mV (e.g., about 10 mV to about 45 mV, or about 20 mV to about 40 mV) in the polishing composition.

The abrasive particles may have substantially any suitable particle size. The particle size of a particle suspended in a liquid carrier may be defined in the industry using various means. For example, the particle size may be defined as the diameter of the smallest sphere that encompasses the particle and may be measured using a number of commercially available instruments, for example, including the CPS Disc Centrifuge, Model DC24000HR (available from CPS Instruments, Prairieville, La.) or the Zetasizer® available from Malvern Instruments®. The abrasive particles may have an average particle size of about 5 nm or more (e.g., about 10 nm or more, about 20 nm or more, or about 30 nm or more). The abrasive particles may have an average particle size of about 250 nm or less (e.g., about 200 nm or less, about 150 nm or less, about 120 nm or less, or about 100 nm or less, or about 80 nm or less). It will thus be understood that the abrasive particles may have an average particle size in a range bounded by any two of the aforementioned endpoints. For example, the abrasive particles may have an average particle size in a range from about 5 nm to about 250 nm (e.g., from about 10 nm to about 200 nm, from about 20 nm to about 150 nm, from about 20 nm to about 120 nm, or from about 30 nm to about 100 nm).

In embodiments in which the abrasive particles include cationic silica particles having a permanent positive charge, the cationic silica particles may advantageously have a particle size greater than about 40 nm (e.g., in a range from about 40 nm to about 200 nm, from about 40 nm to about 150 nm, from about 40 nm to about 120 nm, or from about 40 nm to about 80 nm). In embodiments in which the abrasive particles include cationic silica particles having a non-permanent positive charge, the cationic silica particles may advantageously have a particle size greater than about 90 nm (e.g., in a range from about 90 nm to about 250 nm, from about 90 nm to about 200 nm, from about 90 nm to about 150 nm, or from about 90 nm to about 120 nm).

A liquid carrier is used to facilitate the application of the abrasive and any optional chemical additives to the surface of the substrate to be polished (e.g., planarized). The liquid carrier may be any suitable carrier (e.g., a solvent) including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

The polishing composition is generally acidic having a pH of less than about 7. The polishing composition may have a pH of about 1 or more (e.g., about 2 or more, about 2.5 or more, about 3 or more, or about 3.5 or more). Moreover, the polishing composition may have a pH of about 6 or less (e.g., about 5 or less, about 4.5 or less, or about 4 or less). It will be understood that the polishing composition may have a pH in a range bounded by any two of the aforementioned endpoints, for example, in a range from about 1 to about 5 (e.g., from about 2 to about 5, from about 2 to about 4, from about 2.5 to about 5, from about 3 to about 5, from about 3 to about 4.5, or from about 3.5 to about 5). In embodiments in which the abrasive particles include cationic silica particles having a permanent positive charge, the pH may advantageously be in a range from about 3.5 to about 5. In embodiments in which the abrasive particles include cationic silica particles having a non-permanent positive charge, the pH may advantageously be in a range from about 3 to about 4.5.

It will be understood that the pH of the polishing composition may be achieved and/or maintained by any suitable means. The polishing composition may include substantially any suitable pH adjusting agents or buffering systems. For example, suitable pH adjusting agents may include nitric acid, sulfuric acid, phosphoric acid, phthalic acid, citric acid, adipic acid, oxalic acid, malonic acid, maleic acid, ammonium hydroxide, and the like while suitable buffering agents may include phosphates, sulfates, acetates, malonates, oxalates, borates, ammonium salts, and the like. The disclosed embodiments are not limited in this regard.

Optional embodiments of the polishing composition may further include an iron containing accelerator. An iron containing accelerator as used herein is an iron containing chemical compound that increases the removal rate of tungsten during a tungsten CMP operation. For example, the iron containing accelerator may include a soluble iron containing catalyst such as is disclosed in U.S. Pat. Nos. 5,958,288 and 5,980,775. Such an iron containing catalyst may be soluble in the liquid carrier and may include, for example, ferric (iron III) or ferrous (iron II) compounds such as iron nitrate, iron sulfate, iron halides, including fluorides, chlorides, bromides, and iodides, as well as perchlorates, perbromates and periodates, and organic iron compounds such as iron acetates, carboxylic acids, acetylacetonates, citrates, gluconates, malonates, oxalates, phthalates, and succinates, and mixtures thereof.

An iron containing accelerator may also include an iron containing activator (e.g., a free radical producing compound) or an iron containing catalyst associated with (e.g., coated or bonded to) the surface of the colloidal silica particle such as is disclosed in U.S. Pat. Nos. 7,029,508 and 7,077,880. For example, the iron containing accelerator may be bonded with the silanol groups on the surface of the colloidal surface particle.

The amount of iron containing accelerator in the polishing composition may be varied depending upon whether or not an oxidizing agent used and the chemical form of the accelerator and optional oxidizing agent. When a hydrogen peroxide oxidizer (or one of its analogs) is used and a soluble iron containing catalyst is used (such as ferric nitrate), the catalyst may be present in the composition in an amount sufficient to provide a range from about 0.5 to about 3000 ppm Fe based on the total weight of the composition. The polishing composition may include about 1 ppm Fe or more (e.g., about 2 ppm or more, about 5 ppm or more, or about 10 ppm or more). The polishing composition preferably includes about 500 ppm Fe or less (e.g., about 200 ppm or less, about 100 ppm or less, or about 50 ppm or less). The polishing composition may thus include a range from about 1 to about 500 ppm Fe (e.g., from about 2 to about 200 ppm, from about 5 to about 100 ppm, or from about 10 to about 50 ppm). Polishing compositions used for bulk tungsten removal may include from about 5 to about 50 ppm Fe (e.g., from about 10 to about 40 ppm). Polishing compositions used for a tungsten buffing operation may include from about 0.5 to about 20 ppm Fe (e.g., from about 1 to about 10 ppm Fe).

Embodiments of the polishing composition including an iron containing accelerator may further include a stabilizer.

Without such a stabilizer, the iron containing accelerator and an oxidizing agent, if present, may react in a manner that degrades the oxidizing agent rapidly over time. The addition of a stabilizer tends to reduce the effectiveness of the iron containing accelerator such that the choice of the type and amount of stabilizer added to the polishing composition may have a significant impact on CMP performance. The addition of a stabilizer may lead to the formation of a stabilizer/accelerator complex that inhibits the accelerator from reacting with the oxidizing agent, if present, while at the same time allowing the accelerator to remain sufficiently active so as to promote rapid tungsten polishing rates.

Useful stabilizers include phosphoric acid, organic acids, phosphonate compounds, nitriles, and other ligands which bind to the metal and reduce its reactivity toward hydrogen peroxide decomposition and mixture thereof. The acid stabilizers may be used in their conjugate form, e.g., the carboxylate can be used instead of the carboxylic acid. The term "acid" as it is used herein to describe useful stabilizers also means the conjugate base of the acid stabilizer. For example the term "adipic acid" means adipic acid and its conjugate base. Stabilizers can be used alone or in combination and significantly decrease the rate at which oxidizing agents such as hydrogen peroxide decompose.

The stabilizer may include phosphoric acid, acetic acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid (EDTA), propylenediaminetetraacetic acid (PDTA), and mixtures thereof. Such stabilizers may be added to the disclosed compositions in an amount ranging from about 1 equivalent per iron containing accelerator to about 3.0 weight percent or more (e.g., from about 3 to about 10 equivalents). As used herein, the term "equivalent per iron containing accelerator" means one molecule of stabilizer per iron ion in the composition. For example 2 equivalents per iron containing accelerator means two molecules of stabilizer for each iron ion.

The polishing composition may optionally further include an oxidizing agent. Such an optional oxidizing agent may be added to the polishing composition during the slurry manufacturing process or just prior to the CMP operation (e.g., in a tank located at the semiconductor fabrication facility). Preferable oxidizing agents include inorganic or organic per-compounds. A per-compound as defined herein is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-t-butyl peroxide, monopersulfates ($SO_5^-$), dipersulfates ($S_2O_8^-$), and sodium peroxide. Examples of compounds containing an element in its highest oxidation state include but are not limited to periodic acid, periodate salts, perbromic acid, perbromate salts, perchloric acid, perchlorate salts, perboric acid, and perborate salts and permanganates. The most preferred oxidizing agents is hydrogen peroxide.

When used, an oxidizing agent may be present in the polishing composition in an amount ranging, for example, from about 0.1 to about 10 weight percent. In embodiments in which a hydrogen peroxide oxidizing agent and a soluble iron containing accelerator are used, the oxidizing agent may be present in the polishing composition in an amount ranging from about 0.1 to about 6 weight percent (e.g., from about 0.2 to about 5 weight percent, from about 0.3 to about 4 weight percent, or from about 0.5 to about 3 weight percent).

The disclosed polishing compositions further include at least first and second tungsten corrosion inhibitors including zwitterionic chelating compounds such as amino acid compounds in solution in the liquid carrier. The first tungsten corrosion inhibitor is a neutral zwitterionic chelating compound at the pH of the polishing composition. The second tungsten corrosion inhibitor is a cationic zwitterionic chelating compound at the pH of the polishing composition. The first and second tungsten corrosion inhibitors may be characterized by their corresponding isoelectric points. It will be understood that the isoelectric point (pi) of an organic acid compound is the pH at which the compound as a whole is neutral (uncharged) such that the zwitterion form is dominant. The isoelectric point is also referred to in the art as the isoelectronic point and the isoionic point.

The first and second tungsten corrosion inhibitors may advantageously be amino acid compounds due in part to the availability, affordability, and low toxicity of amino acids. In one embodiment, the first tungsten corrosion inhibitor may be a first amino acid compound that has an isoelectric point of less than 7 (e.g., less than 6). For example, the first amino acid compound may include alanine, phenylalanine, glycine, leucine, isoleucine, proline, tyrosine, valine, and glutamic acid. The first amino acid compound may also have an isoelectric point in a range from about 4 to about 7 (e.g., in a range from about 5 to about 6). For example, the first amino acid compound may be selected from glycine, valine, alanine, and mixtures thereof.

In certain embodiments, the first amino acid compound may include amino acid compounds having non-polar side chains. In such embodiments, the first amino acid compound may be selected from glycine, alanine, valine, leucine, isoleucine, methionine, proline, phenylalanine, tryptophan, and mixtures thereof (e.g., including glycine, alanine, valine, and mixtures thereof).

The second tungsten corrosion inhibitor may be a second amino acid compound that has an isoelectric point of greater than 7 (e.g., greater than 8, or greater than 9). It will be understood that the second amino acid compound is necessarily different than the first amino acid compound. The second amino acid compound may include amino acid compounds having basic side chains. In such embodiments, the second amino acid compound may be selected from lysine, arginine, histidine, and mixtures thereof.

In certain preferred embodiments, the first amino acid compound may be glycine and the second amino acid compound may be lysine, arginine, and/or histidine. In other preferred embodiments, the first amino acid compound may be valine and the second amino acid compound may be lysine, arginine, and/or histidine.

The first and second amino acid compounds may further include polymers compounds having an amino acid monomer unit (also referred to in the art as a polyamino acid). For example, the first amino acid compound may include a polyamino acid having monomer units selected from glycine, alanine, valine, leucine, isoleucine, methionine, proline, phenylalanine, tryptophan, and mixtures thereof. Likewise, the second amino acid may include a polyamino acid having monomer units selected from lysine, arginine, histidine, ornithine, and mixtures thereof. In embodiments, including polymer compounds, the polyamino acid may be a homopolymer or a copolymer. Copolymers include two or more different monomer units. In suitable copolymers at least one of the monomer units is an amino acid.

The polishing composition may include substantially any suitable amount of the first and second tungsten corrosion inhibitors (e.g., amino acid compounds). As described in more detail below, polishing composition may advantageously include a greater amount of the first inhibitor than the second inhibitor (e.g., from about 3 times to about 30 times more of the first inhibitor than the second inhibitor), although the disclosed embodiments are not limited in this regard. If the polishing composition includes too much inhibitor, it may exhibit undesirable polishing performance (e.g., reduced removal rates) and/or may not be cost effective, and/or may lack stability. The polishing composition may include about 0.01 weight percent or more of the first inhibitor (e.g., about 0.02 weight percent or more, about 0.03 weight percent or more, about 0.04 weight percent or more, or about 0.05 weight percent or more). For example, the polishing composition may include about 0.08 weight percent or more (e.g., about 0.1 weight percent or more, about 0.12 weight percent or more, about 0.14 weight percent or more, or about 0.2 weight percent or more) of the first inhibitor. The polishing composition may also include about 2 weight percent or less of the first inhibitor (e.g., about 1.5 weight percent or less, about 1 weight percent or less, or about 0.5 weight percent or less). It will be understood that the first tungsten corrosion inhibitor may be present in the polishing composition at a concentration bounded by any two of the aforementioned endpoints. For example, the concentration of the first inhibitor in the polishing composition may be in a range from about 0.01 weight percent to about 2 weight percent (e.g., from about 0.05 weight percent to about 1 weight percent, from about 0.8 weight percent to about 1 weight percent, or from about 0.1 weight percent to about 1 weight percent).

The polishing composition may also include about 0.001 weight percent or more of the second tungsten corrosion inhibitor, (e.g., about 0.002 weight percent or more, about 0.003 weight percent or more, or about 0.004 weight percent or more). For example, the polishing composition may include about 0.005 weight percent or more (e.g., about 0.008 weight percent or more, about 0.01 weight percent or more, about 0.02 weight percent or more, about 0.03 weight percent or more, or about 0.05 weight percent or more) of the second inhibitor. The polishing composition may also include about 1 weight percent or less of the second inhibitor (e.g., about 0.5 weight percent or less, about 0.2 weight percent or less, about 0.1 weight percent or less, or about 0.05 weight percent or less). It will be understood that the second tungsten corrosion inhibitor may be present in the polishing composition at a concentration bounded by any two of the aforementioned endpoints. For example, the concentration of the second corrosion inhibitor in the polishing composition may be in a range from about 0.001 weight percent to about 1 weight percent (e.g., from about 0.002 weight percent to about 0.5 weight percent, from about 0.005 weight percent to about 0.2 weight percent, or from about 0.005 weight percent to about 0.1 weight percent).

One aspect of the disclosed embodiments is the surprising discovery that the use of a combined tungsten inhibitor system including first and second different tungsten inhibitor compounds as described above provides (i) suitable anti-corrosion performance (tungsten corrosion inhibition) and (ii) chemical and colloidal stability such that both the pH of the composition and the average size of abrasive particles in the composition remain essentially stable with time. It was further discovered that the disclosed polishing compositions may further provide suitable throughput, improved shelf and pot life, and improved planarity including improved array erosion, localized erosion, and tungsten plug and line recessing during a tungsten CMP operation.

The polishing composition may optionally further include a biocide. The biocide may include any suitable biocide, for example an isothiazolinone biocide. The amount of biocide in the polishing composition typically is in a range from about 1 ppm to about 50 ppm, and preferably from about 1 ppm to about 20 ppm.

The polishing composition may be prepared using any suitable techniques, many of which are known to those skilled in the art. The polishing composition may be prepared in a batch or continuous process. Generally, the polishing composition may be prepared by combining the components thereof in any order. The term "component" as used herein includes the individual ingredients (e.g., the abrasive particles, the iron containing accelerator, the first and second amino acid compounds, etc.)

For example, the silica may be dispersed in the aqueous liquid carrier. Other components such as an iron containing accelerator, a stabilizer, the first and second amino acid compounds, and a biocide may then be added and mixed by any method that is capable of incorporating the components into the polishing composition. An optional oxidizing agent may be added at any time during the preparation of the polishing composition. For example, the polishing composition may be prepared prior to use, with one or more components, such as a hydrogen peroxide oxidizing agent, being added just prior to the CMP operation (e.g., within about 1 minute, or within about 10 minutes, or within about 1 hour, or within about 1 day, or within about 1 week of the CMP operation). The polishing composition also may also be prepared by mixing the components at the surface of the substrate (e.g., on the polishing pad) during the CMP operation.

The polishing composition of the invention may also be provided as a concentrate which is intended to be diluted with an appropriate amount of water prior to use. In such an embodiment, the polishing composition concentrate may include abrasive particles, the first and second amino acid compounds, the optional iron containing accelerator and stabilizer, the optional biocide, and water, with or without an oxidizing agent, in amounts such that, upon dilution of the concentrate with an appropriate amount of water, and an oxidizing agent if not already present in an appropriate amount, each component of the polishing composition will be present in the polishing composition in an amount within the appropriate range recited above for each component. For example, abrasive particles, the first and second amino acid compounds, and the optional iron containing accelerator and stabilizer, may each be present in the polishing composition in an amount that is about 2 times (e.g., about 3 times, about 4 times, or about 5 times) greater than the concentration recited above for each component so that, when the concentrate is diluted with an equal volume of (e.g., 1 equal volume of water, 2 equal volumes of water, 3 equal volumes of water, or even 4 equal volumes of water respectively), along with an optional oxidizing agent in a suitable amount, each component will be present in the polishing composition in an amount within the ranges set forth above for each component. Furthermore, as will be understood by those of ordinary skill in the art, the concentrate may contain an appropriate fraction of the water present in the final polishing composition in order to ensure that other components are at least partially or fully dissolved in the concentrate.

Although the polishing composition of the invention may be used to polish any substrate, the polishing composition is particularly useful in the polishing of a substrate comprising at least one metal including tungsten and at least one dielectric material. The tungsten layer may be deposited over one or more barrier layers, for example, including titanium and/or titanium nitride (TiN). The dielectric layer may be a metal oxide such as a silicon oxide layer derived from tetraethylorthosilicate (TEOS), porous metal oxide, porous or non-porous carbon doped silicon oxide, fluorine-doped silicon oxide, glass, organic polymer, fluorinated organic polymer, or any other suitable high or low-k insulating layer.

The polishing method of the invention is particularly suited for use in conjunction with a chemical mechanical polishing (CMP) apparatus. Typically, the apparatus includes a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate (such as tungsten, titanium, titanium nitride, and/or a dielectric material as described herein) to polish the substrate.

A substrate can be planarized or polished with the chemical mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, co-formed products thereof, and mixtures thereof.

It will be understood that the disclosure includes numerous embodiments. These embodiments include, but are not limited to, the following embodiments.

In a first embodiment a chemical mechanical polishing composition for polishing a substrate having a tungsten layer includes a water based liquid carrier, cationic abrasive particles dispersed in the liquid carrier, a first amino acid compound having an isoelectric point of less than 7, a second amino acid compound having an isoelectric point of greater than 7, and a pH in a range from about 1 to about 5.

A second embodiment may include the first embodiment having a pH in a range from about 3 to about 5.

A third embodiment may include any one of the first and second embodiments wherein the first amino acid compound is selected from the group consisting of alanine, phenylalanine, glycine, leucine, isoleucine, proline, tyrosine, valine, glutamic acid, and mixtures thereof.

A fourth embodiment may include any one of the first three embodiments wherein the first amino acid compound is selected from glycine, valine, alanine, and mixtures thereof.

A fifth embodiment may include any one of the first four embodiments wherein the second amino acid compound is selected from the group consisting of histidine, arginine, lysine, and mixtures thereof.

A sixth embodiment may include any one of the first five embodiments wherein the first amino acid compound is glycine and the second amino acid compound is arginine.

A seventh embodiment may include any one of the first six embodiments wherein the composition comprises from about 0.05 to about 1 weight percent of the first amino acid compound and from about 0.005 to about 0.2 weight percent of the second amino acid compound.

An eighth embodiment may include any one of the first seven embodiments wherein the cationic abrasive particles have a zeta potential in a range from about 10 mV to about 40 mV in the composition.

A ninth embodiment may include any one of the first eight embodiments wherein the cationic abrasive particles comprise colloidal silica abrasive particles having a permanent positive charge, the colloidal silica abrasive particles have a zeta potential in range from about 10 mV to about 40 mV in the composition, the colloidal silica abrasive particles have an average particle size greater than about 40 nm, and he composition has a pH in a range from about 3.5 to about 5.

A tenth embodiment may include any one of the first eight embodiments wherein the cationic abrasive particles comprise colloidal silica abrasive particles and the composition further comprises a cationic surfactant that imparts a non-permanent positive charge to the colloidal silica abrasive particles.

An eleventh embodiment may include the tenth embodiment wherein the cationic surfactant comprises one or a combination of tetrabutylammonium, tetrapentylammonium, tetrabutylphosphonium, tributylmethylphosphonium, tributyloctylphosphonium, and benzyltributylammonium.

A twelfth embodiment may include the tenth embodiment wherein the colloidal silica abrasive particles have a zeta potential in range from about 10 mV to about 40 mV in the composition, the colloidal silica abrasive particles have an average particle size greater than about 90 nm, and the composition has a pH in a range from about 3.0 to about 4.5.

A thirteenth embodiment may include any one of the first twelve embodiments wherein the composition further includes an iron containing accelerator.

A fourteenth embodiment may include the thirteenth embodiment wherein the composition further includes a stabilizer bound to the iron containing accelerator, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

A fifteenth embodiment may include any one of the first fourteen embodiments wherein the composition further includes a hydrogen peroxide oxidizer.

In a sixteenth embodiment a chemical mechanical polishing composition for polishing a substrate having a tungsten layer includes a water based liquid carrier, colloidal silica abrasive particles having a permanent positive charge and an average particle size greater than about 40 nm dispersed in the liquid carrier, the colloidal silica abrasive particles having a zeta potential in a range from about 10 mV to about 40 mV in the composition, a first amino acid compound having an isoelectric point less than about 7, a second amino acid compound having an isoelectric point greater than about 7, and a a pH in a range from about 3.5 to about 5.

A seventeenth embodiment may include the sixteenth embodiment wherein the first amino acid compound is selected from the group consisting of glycine, valine, alanine, and mixtures thereof and the second amino acid compound is selected from the group consisting of histidine, arginine, lysine and mixtures thereof.

An eighteenth embodiment may include the sixteenth or seventeenth embodiments wherein the composition includes from about 0.05 to about 1 weight percent of the first amino acid compound and from about 0.005 to about 0.2 weight percent of the second amino acid compound.

A nineteenth embodiment may include any one of the sixteenth through the eighteenth embodiments wherein the composition further includes an iron containing accelerator and a stabilizer bound to the iron containing accelerator, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

A twentieth embodiment may include any one of the sixteenth through the nineteenth embodiments wherein the composition further includes a hydrogen peroxide oxidizer.

In a twenty-first embodiment a polishing composition for polishing a substrate having a tungsten layer includes a water based liquid carrier, colloidal silica abrasive particles having an average particle size greater than about 90 nm, a cationic surfactant that imparts a non-permanent positive charge to the colloidal silica abrasive particles, the colloidal silica abrasive particles having a zeta potential in a range from about 10 mV to about 40 mV in the composition, a first amino acid compound having an isoelectric point less than about 7, a second amino acid compound having an isoelectric point greater than about 7, and a pH in a range from about 3 to about 4.5.

A twenty-second embodiment may include the twenty-first embodiment wherein the first amino acid compound is selected from the group consisting of glycine, valine, alanine, and mixtures thereof and the second amino acid compound is selected from the group consisting of histidine, arginine, lysine and mixtures thereof.

A twenty-third embodiment may include any one of the twenty-first through the twenty-second embodiments wherein the composition further includes from about 0.05 to about 1 weight percent of the first amino acid compound and from about 0.005 to about 0.2 weight percent of the second amino acid compound.

A twenty-fourth embodiment may include any one of the twenty-first through the twenty-third embodiments wherein the cationic surfactant comprises one or a combination of tetrabutylammonium, tetrapentylammonium, tetrabutylphosphonium, tributylmethylphosphonium, tributyloctylphosphonium, and benzyltributylammonium.

A twenty-fifth embodiment may include any one of the twenty-first through the twenty-fourth embodiments wherein the composition further includes an iron containing accelerator and a stabilizer bound to the iron containing accelerator, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

A twenty-sixth embodiment may include any one of the twenty-first through the twenty-fifth embodiments wherein the composition further includes a hydrogen peroxide oxidizer.

In a twenty-seventh embodiment a method for chemical mechanical polishing a substrate including a tungsten layer includes (a) contacting the substrate with a polishing composition comprising a water based liquid carrier, cationic abrasive particles dispersed in the liquid carrier, a first amino acid compound having an isoelectric point less than about 7, a second amino acid compound having an isoelectric point greater than about 7, and a pH in a range from about 1 to about 5. The method further includes (b) moving the polishing composition relative to the substrate and (c) abrading the substrate to remove a portion of the tungsten from the substrate and thereby polish the substrate.

A twenty-eighth embodiment may include the twenty-seventh embodiment wherein the first amino acid compound is selected from the group consisting of glycine, valine, alanine, and mixtures thereof and the second amino acid compound is selected from the group consisting of histidine, arginine, lysine and mixtures thereof.

A twenty-ninth embodiment may include any one of the twenty-seventh through the twenty-eighth embodiments wherein the composition includes from about 0.05 to about 1 weight percent of the first amino acid compound and from about 0.005 to about 0.2 weight percent of the second amino acid compound.

A thirtieth embodiment may include any one of the twenty-seventh through the twenty-ninth embodiments wherein the cationic abrasive particles comprise colloidal silica abrasive particles having a permanent positive charge, the colloidal silica abrasive particles have a zeta potential in range from about 10 mV to about 40 mV in the composition, the colloidal silica abrasive particles have an average particle size greater than about 40 nm, and the composition has a pH in a range from about 3.5 to about 5.

A thirty-first embodiment may include any one of the twenty-seventh through the twenty-ninth embodiments wherein the cationic abrasive particles comprise colloidal silica abrasive particles, the composition further comprises a cationic surfactant that imparts a non-permanent positive charge to the colloidal silica abrasive particles, the colloidal silica abrasive particles have a zeta potential in range from about 10 mV to about 40 mV in the composition, the colloidal silica abrasive particles have an average particle size greater than about 90 nm, and the composition has a pH in a range from about 3.0 to about 4.5.

A thirty-second embodiment may include any one of the twenty-seventh through the thirty-first embodiments wherein the composition further includes a hydrogen peroxide oxidizer, an iron containing accelerator, and a stabilizer bound to the iron containing accelerator, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

The following examples further illustrate the invention but, of course, should not be construed as in any way limiting its scope.

Example 1

A number of polishing compositions were prepared in order to evaluate chemical stability (pH stability) of the compositions. Each composition included 3 weight percent PL-5 colloidal silica (available from Fuso Chemical Company), 0.09 weight percent tetrabutylammonium hydroxide, 0.002 weight percent ferric nitrate nonahydrate, 0.004 weight percent malonic acid, 0.0008 weight percent Kathon LX biocide, and 1 millimolar of an amino acid corrosion inhibitor. Example 1A included no amino acid inhibitor. Examples 1B-1J included the following amino acids as indicated in Table 1; arginine (1B), lysine (1C), histidine (1D). glutamic acid (1E), isoleucine (1F), valine (1G), aspartic acid (1H), proline (1I), and glutamine (1J).

Each composition was prepared as follows: a dispersion was prepared including the PL-5 colloidal silica, tetrabutylammonium hydroxide, ferric nitrate nonahydrate, malonic acid, Kathon LX and amino acid corrosion inhibitor. The pH was adjusted to 3.4 with nitric acid or potassium hydroxide.

The polishing compositions, corresponding amino acid corrosion inhibitor, amino acid type (group A or group B), and pH drift after seven days are provided in Table 1. Note that group A amino acids have an isoelectric point of less than 7 and group B amino acids have an isoelectric point of greater than 7.

TABLE 1

| Polishing Composition | Amino Acid (1 mM) | Amino Acid Type | pH Drift (seven days) |
|---|---|---|---|
| 1A | None | | 0.7 |
| 1B | Arginine | B | >1 |
| 1C | Lysine | B | >1 |
| 1D | Histidine | B | 1.4 |
| 1E | Glutamic Acid | A | 0.5 |
| 1F | Isoleucine | A | 0.13 |
| 1G | Valine | A | 0.16 |
| 1H | Aspartic Acid | A | −0.1 |
| 1I | Proline | A | 0.4 |
| 1J | Glutamine | A | 0.3 |

The data in Table 1 highlight one of the problems with CMP compositions. Note that the pH of the compositions including arginine, lysine, and histidine drifts significantly in just 7 days (the pH of the composition rises over 1 pH unit) as compared to a composition with no tungsten inhibitor. The pH of compositions including glutamic acid, isoleucine, valine, aspartic acid, proline, or glutamine does not drift as significantly.

Example 2

The tungsten static etch rate was evaluated for 22 compositions. Each composition included 3 weight percent PL-5 colloidal silica, 0.09 weight percent tetrabutylammonium hydroxide, 0.002 weight percent iron nitrate nonahydrate, 0.004 weight percent malonic acid, 0.0008 weight percent (8 ppm) Kathon LX biocide, 0.35 weight percent hydrogen peroxide, and 1 mM of an amino acid corrosion inhibitor. The pH was adjusted to 3.4 with nitric acid or potassium hydroxide. In compositions including first and second amino acids corrosion inhibitors, the total concentration of the amino acid combination was 1 mM, with the first and second amino acids included in a 1:1 molar ratio. The compositions were prepared as described above in Example 1.

To obtain the tungsten etch rate for each polishing composition, the composition was first heated to 60 degrees C. after which the hydrogen peroxide was added to a concentration of 0.35 weight percent. After waiting 5 minutes for the temperature to return to 60 degrees, a Silyb tungsten wafer (a 1-inch square coupon) having an 8000 Å thick tungsten layer was submersed in the polishing composition for 5 minutes. Tungsten removal rates were determined via resistivity measurements made before and after immersion of the wafer in the polishing compositions. The amino acid compound(s), amino acid type (group A or group B), and the static etch rate of tungsten are provided in Table 2. Composition 2A included no inhibitor.

TABLE 2

| Polishing Composition | Amino Acid (1 mM) | Amino Acid Type | W Etch Rate (Ang/min) |
|---|---|---|---|
| 2A | None | | 288 |
| 2B | Lysine | B | 123 |
| 2C | Glutamic Acid | A | 286 |
| 2D | Histidine | B | 36 |
| 2E | Isoleucine | A | 273 |
| 2F | Valine | A | 254 |
| 2G | Aspartic Acid | A | 305 |
| 2H | Proline | A | 293 |
| 2I | Arginine | B | 29 |
| 2J | Glutamine | A | 279 |
| 2K | Isoleucine and Histidine | A + B | 62 |
| 2L | Isoleucine and Arginine | A + B | 50 |
| 2M | Isoleucine and Aspartic Acid | A + A | 221 |
| 2N | Isoleucine and Glutamic Acid | A + A | 184 |
| 2O | Valine and Histidine | A + B | 51 |
| 2P | Valine and Arginine | A + B | 39 |
| 2Q | Valine and Aspartic Acid | A + A | 269 |
| 2R | Valine and Glutamic Acid | A + A | 221 |
| 2S | Glutamine and Histidine | A + B | 51 |
| 2T | Glutamine and Arginine | A + B | 41 |
| 2U | Glutamine and Aspartic Acid | A + A | 219 |
| 2V | Glutamine and Glutamic Acid | A + A | 168 |

As is apparent from the results set forth in Table 2, compositions including type B amino acid compounds (particularly arginine and histidine) exhibited low tungsten etch rates at 60 degrees C. (e.g., less than or equal to about 60 Angstroms per minute). The compositions including type A and type B amino acids also exhibited low tungsten etch rates.

Example 3

There are multiple tungsten deposition methods used in the semiconductor industry and the deposition method has been observed to impact tungsten corrosion. In this example, the tungsten static etch rate was evaluated for 26 compositions (3A through 3Z). Each composition included 4 weight percent Fuso PL-5 colloidal silica, 0.09 weight percent tetrabutylammonium hydroxide, 0.0018 weight percent iron nitrate nonahydrate, 0.004 weight percent malonic acid, 8 ppm Kathon LX biocide, 0.15 weight percent hydrogen peroxide, and one or more amino acid compounds. The pH was adjusted to 3.5 with nitric acid. The compositions were prepared as described above in Example 1.

To obtain the tungsten etch rate for each polishing composition, the composition was first heated to 60 degrees C. after which the hydrogen peroxide was added to a concentration of 0.15 weight percent. After waiting 5 minutes for the temperature to return to 60 degrees, a Silyb tungsten wafer (a 1-inch square coupon) having a 2000 Å thick tungsten layer was submersed in the polishing composition for 5 minutes. Tungsten removal rates were determined via resistivity measurements made before and after immersion of the wafer in the polishing compositions. The amino acid compound(s) and their corresponding concentration, amino acid type (group A and/or group B) and concentration in parts per million, and the static etch rate of tungsten are provided in Table 3. Composition 3A included no inhibitor.

TABLE 3

| Polishing Composition | Amino Acid (ppm) | Amino Acid Type | W Etch Rate (Ang/min) |
|---|---|---|---|
| 3A | None | | 249 |
| 3B | Glycine (1400) | A | 25 |
| 3C | Valine (1400) | A | 73 |
| 3D | Isoleucine (1400) | A | 50 |
| 3E | Histidine (200) | B | 15 |
| 3F | Lysine (200) | B | 72 |
| 3G | Arginine (200) | B | 11 |
| 3H | Arginine (100) | B | 17 |
| 3I | Glutamic Acid (1400) | A | 18 |
| 3J | Glycine (1400) Histidine (200) | A + B | 11 |
| 3K | Glycine (1400) Histidine (100) | A + B | 7 |
| 3L | Valine (1400) Histidine (200) | A + B | 10 |
| 3M | Valine (1400) Histidine (100) | A + B | 10 |
| 3N | Isoleucine (1400) Histidine (200) | A + B | 9 |
| 3O | Glycine (1400) Lysine (200) | A + B | 17 |
| 3P | Valine (1400) Lysine (200) | A + B | 27 |
| 3Q | Isoleucine (1400) Lysine (200) | A + B | 21 |
| 3R | Glycine (1400) Arginine (200) | A + B | 7 |
| 3S | Glycine (1400) Arginine (100) | A + B | 11 |
| 3T | Valine (1400) Arginine (200) | A + B | 11 |
| 3U | Valine (1400) Arginine (100) | A + B | 14 |
| 3V | Isoleucine (1400) Arginine (200) | A + B | 8 |
| 3W | Glutamic Acid (1400) Histidine (200) | A + B | 5 |
| 3X | Glutamic Acid (1400) Histidine (100) | A + B | 5 |
| 3Y | Glutamic Acid (1400) Valine (200) | A + A | 173 |
| 3Z | Glutamic Acid (1400) Valine (100) | A + A | 248 |

As is apparent from the results set forth in Table 3, compositions including type B amino acid compounds (particularly arginine and histidine) exhibited low tungsten etch rates at 60 degrees C. (e.g., less than or equal to about 30 Angstroms per minute). The compositions including type A and type B amino acids also exhibited low tungsten etch rates.

Example 4

Twenty two polishing compositions (4A through 4V) were prepared to evaluate chemical and colloidal stability of polishing compositions including amino acid compounds, particularly compositions including a combination of type A and type B amino acid compounds as compared with compositions including only type B amino acid compounds. Each of the polishing compositions was prepared as a 3× concentrate and included 12 weight percent of the indicated colloidal silica (Fuso PL-2, PL-5, or PL-7), 0.27 weight percent tetrabutylammonium hydroxide, 0.0054 weight percent iron nitrate nonahydrate, 0.012 weight percent malonic acid, and 15 ppm Kathon LX biocide. Table 4A indicates the amino acid compound(s) and their corresponding concentration prior to dilution, the pH and the silica included in each composition.

TABLE 4A

| Polishing Composition | Amino Acid (ppm) | Amino Acid Type | pH | Silica (size) |
|---|---|---|---|---|
| 4A | Glycine (4200) Histidine (300) | A + B | 3.5 | PL-5 (100 nm) |
| 4B | Glycine (4200) Arginine (300) | A + B | 3.5 | PL-5 (100 nm) |
| 4C | Glycine (4200) Lysine (300) | A + B | 3.5 | PL-5 (100 nm) |
| 4D | Valine (4200) Histidine (300) | A + B | 3.5 | PL-5 (100 nm) |
| 4E | Valine (4200) Arginine (300) | A + B | 3.5 | PL-5 (100 nm) |
| 4F | Valine (4200) Lysine (300) | A + B | 3.5 | PL-5 (100 nm) |
| 4G | Glycine (4200) Histidine (300) | A + B | 2.3 | PL-5 (100 nm) |
| 4H | Glycine (4200) Arginine (300) | A + B | 3.5 | PL-2 (40 nm) |
| 4I | Glycine (4200) Arginine (300) | A + B | 3.5 | PL-7 (120 nm) |
| 4J | Glycine (4200) Histidine (600) | A + B | 3.5 | PL-5 (100 nm) |
| 4K | Glycine (4200) Lysine (600) | A + B | 3.5 | PL-5 (100 nm) |
| 4L | Valine (4200) Lysine (600) | A + B | 3.5 | PL-5 (100 nm) |
| 4M | Valine (4200) Arginine (600) | A + B | 3.5 | PL-5 (100 nm) |
| 4N | Valine (4200) Histidine (600) | A + B | 3.5 | PL-5 (100 nm) |
| 4O | Glycine (4200) Glutamic Acid (4200) | A + A | 3.5 | PL-5 (100 nm) |
| 4P | Valine (4200) | A | 3.5 | PL-5 (100 nm) |
| 4Q | Histidine (300) | B | 3.5 | PL-5 (100 nm) |
| 4R | Arginine (300) | B | 3.5 | PL-5 (100 nm) |
| 4S | Lysine (300) | B | 3.5 | PL-5 (100 nm) |
| 4T | Histidine (600) | B | 3.5 | PL-5 (100 nm) |
| 4U | Arginine (600) | B | 3.5 | PL-5 (100 nm) |
| 4V | Lysine (600) | B | 3.5 | PL-5 (100 nm) |

As indicated in Table 4A, composition 4H included Fuso PL-2 (40 nm). Composition 4I included Fuso PL-7 (120 nm). The remainder of the compositions (4A-4G and 4J-4V) included Fuso PL-5 (100 nm). The pH of composition 4G was adjusted to 2.3 using nitric acid. The pH of the remaining compositions was adjusted to 3.5 using nitric acid. The compositions were prepared as described above in Example 1.

Diluted polishing compositions were prepared by diluting the above described compositions with deionized water (1 part polishing composition to 2 parts water). The diluted compositions represent example point-of-use polishing compositions as used in a CMP operation. These diluted compositions were monitored for chemical and colloidal stability (pH, particle size, and zeta potential) after 3 weeks at room temperature. The abrasive particle size and zeta potential were measured using a Zetasizer® available from Malvern Instruments. The amino acid compound(s) and their corresponding concentration after dilution, amino acid type (group A and/or group B), pH, particle size, and zeta potential are provided in Table 4.

TABLE 4B

| Polishing Composition | AminoAcid (ppm) | Amino Acid Type | pH | Particle Size (nm) | Zeta Potential (mV) |
|---|---|---|---|---|---|
| 4A | Glycine (1400) Histidine (100) | A + B | 3.6 | 101 | 13.6 |
| 4B | Glycine (1400) Arginine (100) | A + B | 3.6 | 104 | 13.4 |
| 4C | Glycine (1400) Lysine (100) | A + B | 3.7 | 106 | 13.8 |
| 4D | Valine (1400) Histidine (100) | A + B | 4.1 | 103 | 12.8 |
| 4E | Valine (1400) Arginine (100) | A + B | 3.9 | 104 | 13.7 |
| 4F | Valine (1400) Lysine (100) | A + B | 3.9 | 105 | 13.9 |
| 4G | Glycine (1400) Histidine (100) | A + B | 2.5 | 101 | 12.4 |
| 4H | Glycine (1400) Arginine (100) | A + B | 3.5 | 46 | 11.3 |
| 4I | Glycine (1400) Arginine (100) | A + B | 3.7 | 128 | 15.3 |
| 4J | Glycine (1400) Histidine (200) | A + B | 3.8 | 103 | 13.4 |
| 4K | Glycine (1400) Lysine (200) | A + B | 3.7 | 103 | 13.5 |
| 4L | Valine (1400) Lysine (200) | A + B | 4.0 | 102 | 13.0 |
| 4M | Valine (1400) Arginine (200) | A + B | 3.9 | 103 | 13.3 |
| 4N | Valine (1400) Histidine (200) | A + B | 3.6 | 103 | 11.8 |
| 4O | Glycine (1400) Glutamic Acid (1400) | A + A | 3.6 | 102 | 13.6 |
| 4P | Valine (1400) | A | 3.8 | 98 | 12.6 |
| 4Q | Histidine (100) | B | 5.0 | 145 | 7.8 |
| 4R | Arginine (100) | B | 5.3 | 1160 | 7.5 |
| 4S | Lysine (100) | B | 5.4 | 2990 | 15.6 |
| 4T | Histidine (200) | B | 4.9 | 107 | 9.2 |
| 4U | Arginine (200) | B | 5.2 | 1290 | 8.4 |
| 4V | Lysine (200) | B | 5.2 | 1030 | 12.2 |

It is evident from the data set forth in Table 4 that the polishing compositions including a combination of type A and type B amino acid compounds have superior chemical and colloidal stability to the polishing compositions including only type B amino acid compounds. By comparing further comparing the data set forth in Tables 2 and 3 it is evident that only the polishing compositions including a combination of type A and type B amino acid compounds have suitable chemical and colloidal stability and acceptably low tungsten etch rates. In particular, the polishing compositions including only type A inhibitors exhibit high tungsten static etch rates, while those including only type B inhibitors are chemically and colloidally unstable.

Example 5

The polishing performance of polishing compositions 4A through 4V (defined above in Table 4A of Example 4) and compositions 5A through 5H was evaluated. With the exception of composition 5B, each of the polishing compositions was prepared as a 3x concentrate and included 12 weight percent colloidal silica, 0.27 weight percent tetrabutylammonium hydroxide, 0.0054 weight percent iron nitrate nonahydrate, 0.012 weight percent malonic acid, and 15 ppm Kathon LX biocide. Polishing composition 5B was prepared as a 1.5x concentrate and included 6 weight percent colloidal silica, 0.14 weight percent tetrabutylammonium hydroxide, 0.0027 weight percent iron nitrate nonahydrate, 0.006 weight percent malonic acid, and 8 ppm Kathon LX biocide. Each composition was adjusted to pH 3.5 using nitric acid. Table 5A indicates the amino acid compound(s) and their corresponding concentration prior to dilution and the particular silica included in each composition.

TABLE 5A

| Polishing Composition | Amino Acid (ppm) | Amino Acid Type | Silica (size) |
|---|---|---|---|
| 5A | Proline (4200) Arginine (300) | A + B | PL-5 (100 nm) |
| 5B | Glutamic Acid (2100) Arginine (150) | A + B | PL-5 (100 nm) |
| 5C | Proline (4200) Arginine (3000) | A + B | PL-5 (100 nm) |
| 5D | Alanine (4200) Lysine (300) | A + B | PL-5 (100 nm) |
| 5E | Glycine (4200) Arginine (300) | A + B | PL-7 (120 nm) |
| 5F | Glycine (4200) Arginine (300) | A + B | DVSTS006 (60 nm) |
| 5G | Glycine (4200) Arginine (300) | A + B | Tama 14 (72 nm) |
| 5H | Glycine (4200) Arginine (300) | A + B | NexSil 85K-40 (75 nm) |

As indicated in Table 5A, compositions 5A-5D included Fuso PL-5 (100 nm). Composition 5E included Fuso PL-7 (120 nm). Composition 5F included DVSTS006 (60 nm) available from Nalco. Composition 5G included Tama 14 (72 nm). Composition 5H included NexSil® 85K-40 (75 nm) available from Nyacol Nano Technologies. This example illustrates certain advantages of the disclosed embodiments in tungsten buffing CMP. Polishing compositions found to be unstable, such as by exhibiting particle growth (>15%) or pH drift (>1 unit), were not considered suitable for polishing (see Example 4). Tungsten pattern wafers (Silyb W854 L&S patterns) were prepared by polishing to endpoint+10% using an Applied Materials Mirra polishing tool and W8051 tungsten CMP slurry available from Cabot Microelectronics Corp. These pre-polished wafers were buff polished using diluted polishing compositions selected from Tables 4A and 5A. Each of the pre-polished wafers was buff polished using a Mirra polishing tool, a NexPlanar E6088 polishing pad (available from Cabot Microelectronics), a Saesol Cl conditioner (in-situ mode at 6 lbs.) using a down force of 2.5 psi, a platen speed of 100 rpm, a head speed of 101 rpm, and a slurry flow rate of 180 ml/min. Blanket tungsten wafers (8000 Å available from Novati) and TEOS wafers (20000 Å available from WRS Materials) were also polished for 60 seconds at the same conditions. The patterned wafers were polished for corresponding times based on the blanket TEOS removal rates with a target of 600 Å TEOS removal.

Table 5B presents blanket and patterned wafer polishing data for polishing compositions 4A-4C, 4F-4J, and 5A-5H. Each polishing composition was diluted prior to polishing (to 3 weight percent silica) and included 0.3 weight percent hydrogen peroxide. Table 5B lists the blanket TEOS removal rate (RR), the blanket tungsten removal rate (RR), the field oxide removed from the patterned wafer, localized erosion (sometimes referred to as fang in the industry) on a 1 µm isolated tungsten line, array oxide erosion on a 1×9 µm array (10% W), and tungsten line protrusion on a 1×9 µm array (10% W) for each polishing composition.

TABLE 5B

| Polishing Composition | TEOS RR (Å/min) | W RR (Å/min) | Field Oxide (Å) | Local Erosion (Å) | Array Erosion (Å) | W Line Protrusion (Å) |
|---|---|---|---|---|---|---|
| 4A | 513 | 265 | 562 | Not Detected | 14 | 171 |
| 4B | 532 | 269 | 605 | Not Detected | 57 | 254 |
| 4C | 499 | 317 | 643 | Not Detected | 17 | 220 |
| 4F | 499 | 283 | 551 | Not Detected | 48 | 189 |
| 4G | 590 | 212 | 651 | 55 | 70 | 300 |
| 4H | 1407 | 302 | 665 | 53 | 82 | 444 |
| 4I | 366 | 265 | 624 | Not Detected | 65 | 160 |
| 4J | 508 | 270 | 552 | Not Detected | 57 | 224 |
| 5A | 517 | 254 | 594 | Not Detected | 13 | 264 |
| 5B | 533 | 266 | 594 | Not Detected | 34 | 240 |
| 5C | 561 | 208 | 629 | Not Detected | 44 | 322 |
| 5D | 505 | 299 | 648 | Not Detected | 27 | 197 |
| 5E | 367 | 211 | 619 | Not Detected | 23 | 181 |
| 5F | 1176 | 232 | 559 | Not Detected | 1 | 285 |
| 5G | 998 | 239 | 565 | Not Detected | 13 | 278 |
| 5H | 1385 | 251 | 543 | Not Detected | 13 | 268 |

As is evident from the data set forth in Table 5B, the disclosed polishing compositions including a group A amino acid compound and a group B amino acid compound exhibit low array oxide erosion and W line protrusion and undetected localized erosion on an isolated line.

Example 6

The polishing performances of two polishing compositions employing cationic silica having a permanent positive charge were evaluated. Each polishing composition was prepared as a 3× concentrate and included 12 weight percent colloidal silica, 0.27 weight percent tetrabutylammonium hydroxide, 0.0054 weight percent iron nitrate nonahydrate, 0.012 weight percent malonic acid, 15 ppm Kathon LX biocide, 4200 ppm Proline, and 300 ppm Arginine. The cationic silica particles were prepared as described in Example 13 of commonly assigned U.S. Pat. No. 9,422,456. The pH of polishing composition 6A was adjusted to 4.5 using nitric acid. The pH of composition 6B was adjusted to 3.5 using nitric acid.

Tungsten patterned wafers, tungsten blanket wafers, and TEOS blanket wafers were polished as described above with respect to Example 5. Table 6 presents blanket and patterned wafer polishing data for polishing compositions 6A and 6B. Each polishing composition was diluted prior to polishing (to 3 weight percent silica) and included 0.3 weight percent hydrogen peroxide. Table 6 lists the same metrics as shown in Table 5B.

TABLE 6

| Polishing Composition | TEOS RR (Å/min) | W RR (Å/min) | Field Oxide (Å) | Local Erosion (Å) | Array Erosion (Å) | W Line Protrusion (Å) |
|---|---|---|---|---|---|---|
| 6A | 1393 | 354 | 565 | Not Detected | 1 | 286 |
| 6B | 518 | 328 | 1212 | 104 | 115 | 561 |

As is evident from the data set forth in Table 6, the disclosed polishing compositions including a group A amino acid compound and a group B amino acid compound and a permanently charged cationic silica exhibit low array erosion and W line protrusion and undetected localized erosion on an isolated W line, particularly at pH greater than 3.5.

Example 7

Eight polishing compositions were prepared to evaluate pH drift and static etch rate as a function of amino acid concentration in the polishing composition. Each polishing composition included 4.5 weight percent Fuso PL-5 colloidal silica, 0.09 weight percent tetrabutylammonium hydroxide, 0.0018 weight percent iron nitrate nonahydrate, 0.004 weight percent malonic acid, 8 ppm Kathon LX biocide. The pH was adjusted to 3.5 using nitric acid. Compositions 7A-7D included valine (type A) and compositions 7E-7H included histidine (type B). Hydrogen peroxide was added to each composition to a concentration of 0.15 weight percent. The static etch rates were obtained as described above in Example 3 (using the W wafer coupons described above in Example 2).

Table 7 discloses the amino acid, the amino acid concentration, the static etch rate, and the pH drift (after two days) for each composition.

TABLE 7

| Polishing Composition | Amino Acid | [Amino Acid] (ppm) | W SER (Å/min) | pH drift |
|---|---|---|---|---|
| 7A | Valine | 100 | 100 | 0.8 |
| 7B | Valine | 400 | 110 | 0.4 |
| 7C | Valine | 800 | 98 | 0.2 |
| 7D | Valine | 1400 | 100 | 0.1 |
| 7E | Histidine | 25 | 28 | 0.7 |
| 7F | Histidine | 50 | 6 | 0.4 |
| 7G | Histidine | 100 | 4 | 0.6 |
| 7H | Histidine | 500 | 5 | 0.4 |

As is evident in the data set forth in Table 7, minimal pH drift can be achieved using higher concentrations of type A amino acids (e.g., greater than 1000 ppm) and significantly reduced static etch rates can be achieved at greater than about 25 ppm of type B amino acids.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical mechanical polishing composition for polishing a substrate having a tungsten layer, the composition comprising:
   a water based liquid carrier;
   cationic abrasive particles dispersed in the liquid carrier;
   a first amino acid compound having an isoelectric point of less than 7;
   a second amino acid compound having an isoelectric point of greater than 7; and
   a pH in a range from about 1 to about 5.

2. The composition of claim 1, having a pH in a range from about 3 to about 5.

3. The composition of claim 1, wherein the first amino acid compound is selected from the group consisting of alanine, phenylalanine, glycine, leucine, isoleucine, proline, tyrosine, valine, glutamic acid, and mixtures thereof.

4. The composition of claim 1, wherein the first amino acid compound is selected from glycine, valine, alanine, and mixtures thereof.

5. The composition of claim 1, wherein the second amino acid compound is selected from the group consisting of histidine, arginine, lysine, and mixtures thereof.

6. The composition of claim 1, wherein the first amino acid compound is glycine and the second amino acid compound is arginine.

7. The composition of claim 1 comprising:
   from about 0.05 to about 1 weight percent of the first amino acid compound; and
   from about 0.005 to about 0.2 weight percent of the second amino acid compound.

8. The composition of claim 1, wherein the cationic abrasive particles have a zeta potential in a range from about 10 mV to about 40 mV in the composition.

9. The composition of claim 1, wherein:
   the cationic abrasive particles comprise colloidal silica abrasive particles having a permanent positive charge;
   the colloidal silica abrasive particles have a zeta potential in range from about 10 mV to about 40 mV in the composition;
   the colloidal silica abrasive particles have an average particle size greater than about 40 nm; and
   the composition has a pH in a range from about 3.5 to about 5.

10. The composition of claim 1, further comprising an iron containing accelerator.

11. The composition of claim 10, further comprising a stabilizer bound to the iron containing accelerator, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

12. The composition of claim 1, further comprising a hydrogen peroxide oxidizer.

13. A chemical mechanical polishing composition for polishing a substrate having a tungsten layer, the composition comprising:
   a water based liquid carrier;
   colloidal silica abrasive particles having a permanent positive charge and an average particle size greater than about 40 nm dispersed in the liquid carrier;
   the colloidal silica abrasive particles having a zeta potential in a range from about 10 mV to about 40 mV in the composition;
   a first amino acid compound having an isoelectric point less than about 7;
   a second amino acid compound having an isoelectric greater than about 7; and
   a pH in a range from about 3.5 to about 5.

14. The composition of claim 13, wherein the first amino acid compound is selected from the group consisting of glycine, valine, alanine, and mixtures thereof and the second amino acid compound is selected from the group consisting of histidine, arginine, lysine and mixtures thereof.

15. The composition of claim 14, comprising:
   from about 0.05 to about 1 weight percent of the first amino acid compound; and
   from about 0.005 to about 0.2 weight percent of the second amino acid compound.

16. The composition of claim 13, further comprising an iron containing accelerator and a stabilizer bound to the iron containing accelerator, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

17. The composition of claim 13, further comprising a hydrogen peroxide oxidizer.

18. A chemical mechanical polishing composition for polishing a substrate having a tungsten layer, the composition comprising:
   a water based liquid carrier;
   colloidal silica abrasive particles having an average particle size greater than about 90 nm dispersed in the liquid carrier;
   a cationic surfactant that imparts a non-permanent positive charge to the colloidal silica abrasive particles;
   the colloidal silica abrasive particles having a zeta potential in a range from about 10 mV to about 40 mV in the composition;
   a first amino acid compound having an isoelectric point less than about 7;
   a second amino acid compound having an isoelectric greater than about 7; and
   a pH in a range from about 3 to about 4.5.

19. The composition of claim 18, wherein the first amino acid compound is selected from the group consisting of glycine, valine, alanine, and mixtures thereof and the second amino acid compound is selected from the group consisting of histidine, arginine, lysine and mixtures thereof.

20. The composition of claim 19, comprising:
   from about 0.05 to about 1 weight percent of the first amino acid compound; and
   from about 0.005 to about 0.2 weight percent of the second amino acid compound.

21. The composition of claim 19, wherein the cationic surfactant comprises one or a combination of tetrabutylammonium, tetrapentylammonium, tetrabutylphosphonium, tributylmethylphosphonium, tributyloctylphosphonium, and benzyltributylammonium.

22. The composition of claim 19, further comprising an iron containing accelerator and a stabilizer bound to the iron containing accelerator, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

23. The composition of claim 19, further comprising a hydrogen peroxide oxidizer.

24. A method of chemical mechanical polishing a substrate including a tungsten layer, the method comprising:
   (a) contacting the substrate with a polishing composition comprising:
      (i) a water based liquid carrier;
      (ii) cationic abrasive particles dispersed in the liquid carrier;
      (iii) a first amino acid compound having an isoelectric point less than about 7;
      (iv) a second amino acid compound having an isoelectric point greater than about 7; and
      (v) a pH in a range from about 1 to about 5,
   (b) moving the polishing composition relative to the substrate; and
   (c) abrading the substrate to remove a portion of the tungsten from the substrate and thereby polish the substrate.

25. The method of claim 24, wherein the first amino acid compound is selected from the group consisting of glycine, valine, alanine, and mixtures thereof and the second amino acid compound is selected from the group consisting of histidine, arginine, lysine and mixtures thereof.

26. The method of claim 25, wherein the polishing composition comprises:
   from about 0.05 to about 1 weight percent of the first amino acid compound; and
   from about 0.005 to about 0.2 weight percent of the second amino acid compound.

27. The method of claim 24, wherein:
   the cationic abrasive particles comprise colloidal silica abrasive particles having a permanent positive charge;
   the colloidal silica abrasive particles have a zeta potential in range from about 10 mV to about 40 mV in the composition;
   the colloidal silica abrasive particles have an average particle size greater than about 40 nm; and
   the composition has a pH in a range from about 3.5 to about 5.

28. The method of claim 24, wherein:
   the cationic abrasive particles comprise colloidal silica abrasive particles;
   the composition further comprises a cationic surfactant that imparts a non-permanent positive charge to the colloidal silica abrasive particles;
   the colloidal silica abrasive particles have a zeta potential in range from about 10 mV to about 40 mV in the composition;
   the colloidal silica abrasive particles have an average particle size greater than about 90 nm; and
   the composition has a pH in a range from about 3.0 to about 4.5.

29. The method of claim 24, wherein the composition further comprises
   an iron containing accelerator;
   a stabilizer bound to the iron containing accelerator, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof; and
   a hydrogen peroxide oxidizer.

* * * * *